United States Patent
Cho et al.

(10) Patent No.: US 11,917,872 B2
(45) Date of Patent: Feb. 27, 2024

(54) DISPLAY DEVICE

(71) Applicant: Samsung Display Co., Ltd., Yongin-Si (KR)

(72) Inventors: Yoonjong Cho, Yongin-si (KR); Seokje Seong, Yongin-si (KR); Jaehyun Lee, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 30 days.

(21) Appl. No.: 16/406,243

(22) Filed: May 8, 2019

(65) Prior Publication Data

US 2020/0091268 A1    Mar. 19, 2020

(30) Foreign Application Priority Data

Sep. 17, 2018   (KR) .......................... 10-2018-0111031

(51) Int. Cl.
  *H01L 27/12*   (2006.01)
  *H10K 59/131*  (2023.01)
  *H10K 59/121*  (2023.01)

(52) U.S. Cl.
  CPC ....... *H10K 59/131* (2023.02); *H01L 27/1225* (2013.01); *H10K 59/1216* (2023.02)

(58) Field of Classification Search
  CPC ............. H01L 27/3276; H01L 27/1225; H01L 27/3265
  USPC ......................................................... 257/40
  See application file for complete search history.

(56) References Cited

U.S. PATENT DOCUMENTS

| | | | |
|---|---|---|---|
| 5,184,949 A | 2/1993 | O'Brien | |
| 7,462,994 B2 * | 12/2008 | Inagaki | H05B 45/40 315/291 |
| 8,933,344 B2 | 1/2015 | Jeon | |
| 9,159,119 B2 | 10/2015 | Shechtman et al. | |
| 9,640,600 B2 | 5/2017 | Oooka et al. | |
| 2007/0155090 A1 * | 7/2007 | Barth | H01L 28/91 257/E27.048 |
| 2015/0214271 A1 * | 7/2015 | Shimotsusa | H01L 27/14689 438/59 |
| 2016/0322453 A1 * | 11/2016 | Park | H01L 27/3279 |
| 2017/0278916 A1 | 9/2017 | Maruyama | |
| 2018/0019431 A1 | 1/2018 | Kurata et al. | |
| 2018/0033849 A1 * | 2/2018 | Noh | H01L 27/1222 |
| 2018/0061921 A1 | 3/2018 | Son et al. | |
| 2018/0197484 A1 | 7/2018 | Moon et al. | |

(Continued)

FOREIGN PATENT DOCUMENTS

| | | |
|---|---|---|
| KR | 10-2014-0045192 A | 4/2014 |
| KR | 10-2015-0105203 A | 9/2015 |
| KR | 10-2017-0110503 A | 10/2017 |

(Continued)

*Primary Examiner* — Ori Nadav
(74) *Attorney, Agent, or Firm* — Innovation Counsel LLP

(57) ABSTRACT

Provided is a display device including: a substrate having a display area and a peripheral area outside the display area; a first transistor and a second transistor each located over the display area of the substrate and arranged at different levels on the substrate; and a plurality of wirings located over the peripheral area of the substrate, wherein the plurality of wirings include first wirings and second wirings, the first wirings and the second wirings being located at different levels on the substrate and are alternately arranged with each other.

14 Claims, 7 Drawing Sheets

(56) References Cited

U.S. PATENT DOCUMENTS

2019/0267421 A1* 8/2019 Suzuki .............. H01L 27/14623

FOREIGN PATENT DOCUMENTS

| KR | 10-2018-0008266 A | 1/2018 |
| KR | 10-2018-0025427 A | 3/2018 |
| KR | 10-2018-0082688 A | 7/2018 |

* cited by examiner

DISPLAY DEVICE

CROSS-REFERENCE TO RELATED APPLICATION

This application claims the benefit of Korean Patent Application No. 10-2018-0111031, filed on Sep. 17, 2018, in the Korean Intellectual Property Office, the disclosure of which is incorporated herein in its entirety by reference.

BACKGROUND

1. Field

One or more embodiments relate to a display device.

2. Description of the Related Art

In accordance with the rapid progress in the field of displays which visually represent various kinds of electrical signal information, diverse flat panel display devices having excellent characteristics such as a small thickness, a light weight, and low power consumption have been introduced. In addition, display devices have been developed in which an extended display area is provided without physical buttons on a front surface.

In order to provide a display device with a higher resolution, it is necessary to provide a greater number of wirings through which an electrical signal is transmitted to a display area. However, under conditions in which a display area of a display device is increased and a non-display area of the display device is decreased accordingly, the distance between the wirings which have increased in number becomes smaller, and this may cause coupling between the wirings and degrade image quality of the display device.

SUMMARY

One or more embodiments include a display device in which coupling between wirings through which an electrical signal is transmitted to a display area may be prevented or reduced.

Additional aspects will be set forth in part in the description which follows and, in part, will be apparent from the description, or may be learned by practice of the presented embodiments.

According to one or more embodiments, a display device includes: a substrate having a display area and a peripheral area outside the display area; a first transistor and a second transistor each located over the display area of the substrate and arranged at different levels on the substrate; and a plurality of wirings located over the peripheral area of the substrate, wherein the plurality of wirings may include first wirings and second wirings, the first wirings and the second wirings being located at different levels on the substrate and are alternately arranged with each other.

The first transistor may include a first semiconductor layer including polycrystalline silicon, and the second transistor may include a second semiconductor layer including an oxide semiconductor.

The display device may further include a display element electrically connected to the first transistor, wherein the first transistor may be a driving transistor, and the second transistor may be a switching transistor.

The display device may further include a capacitor overlapping the first transistor, wherein a first electrode of the capacitor may be arranged on a same layer as a first gate electrode of the first transistor.

The capacitor may further include a second electrode overlapping the first electrode, wherein the display device may further include a first insulating layer between the first semiconductor layer and the first gate electrode, a second insulating layer between the first gate electrode and the second electrode, and a third insulating layer on the second electrode, wherein the second semiconductor layer may be located on the third insulating layer.

The second transistor may further include a second gate electrode on the second semiconductor layer.

The first wirings may include a same material as the first gate electrode, and the second wirings may include a same material as the second gate electrode.

The display device may further include a fourth insulating layer between the second semiconductor layer and the second gate electrode, wherein the first wirings may be on the first insulating layer and the second wirings may be on the fourth insulating layer.

The first wirings and the second wirings may at least partially overlap each other in a vertical direction.

The display device may further include a fourth insulating layer and a fifth insulating layer, wherein the fourth insulating layer may be between the second semiconductor layer and the second gate electrode, and the fifth insulating layer may be on the second gate electrode, wherein the peripheral area may further include a pad area and a bending area that is between the display area and the pad area, wherein the bending area may be an area from which the first insulating layer, the second insulating layer, the third insulating layer, the fourth insulating layer, and the fifth insulating layer are removed, and an organic material layer may be located in the bending area.

The first wirings and the second wirings may include disconnected portions in the bending area, and the first wirings and the second wirings that are disconnected in the bending area may be connected via a connecting wire located on the organic material layer.

The connecting wire may include first connecting wires connecting the disconnected portions of the first wirings and second connecting wires connecting the disconnected portions of the second wirings.

The first connecting wires may connect the disconnected portions of the first wirings through contact holes in the second insulating layer, the third insulating layer, the fourth insulating layer and the fifth insulating layer, and the second connecting wires may connect the disconnected portions of the second wirings through contact holes in the fifth insulating layer.

According to one or more embodiments, a display device includes: a substrate having a display area and a peripheral area outside the display area; a first transistor located over the display area of the substrate and including a first semiconductor layer including polycrystalline silicon and a first gate electrode; a second transistor located over the display area of the substrate and including a second semiconductor layer including an oxide semiconductor and a second gate electrode; and a plurality of wirings located over the peripheral area of the substrate, wherein the first gate electrode and the second gate electrode are located at difference levels on the substrate, wherein the plurality of wirings may include first wirings and second wirings, wherein the first wirings are arranged on a same layer as the first gate electrode and the second wirings are arranged on a same layer as the second gate electrode.

The first wirings and the second wirings may be alternately arranged with each other.

The first wirings and the second wirings may at least partially overlap each other in a vertical direction.

The display device may further include an organic light-emitting device electrically connected to the first transistor, wherein the first transistor may be a driving transistor, and the second transistor may be a switching transistor.

The display device may further include a capacitor overlapping the first transistor, wherein the capacitor may include a first electrode and a second electrode, the first electrode may be arranged on a same layer as the first gate electrode, and the second electrode may be arranged on and overlaps the first electrode.

The display device may further include a first insulating layer between the first semiconductor layer and the first gate electrode, a second insulating layer between the first gate electrode and the second electrode, a third insulating layer between the second electrode and the second semiconductor layer, a fourth insulating layer between the second semiconductor layer and the second gate electrode, and a fifth insulating layer on the second gate electrode.

The first transistor may further include a first source electrode and a first drain electrode that are located on the fifth insulating layer and electrically connected to the first semiconductor layer, wherein the second transistor may further include a second source electrode and a second drain electrode that are located on the fifth insulating layer and electrically connected to the second semiconductor layer.

The peripheral area may further include a pad area and a bending area that is between the display area and the pad area, wherein the bending area may be an area from which the first insulating layer, the second insulating layer, the third insulating layer, the fourth insulating layer, and the fifth insulating layer are removed, and an organic material layer may be located in the bending area.

The first wirings and the second wirings may include disconnected portions in the bending area, and the first wirings and the second wirings that are disconnected in the bending area may be connected via a connecting wire located on the organic material layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
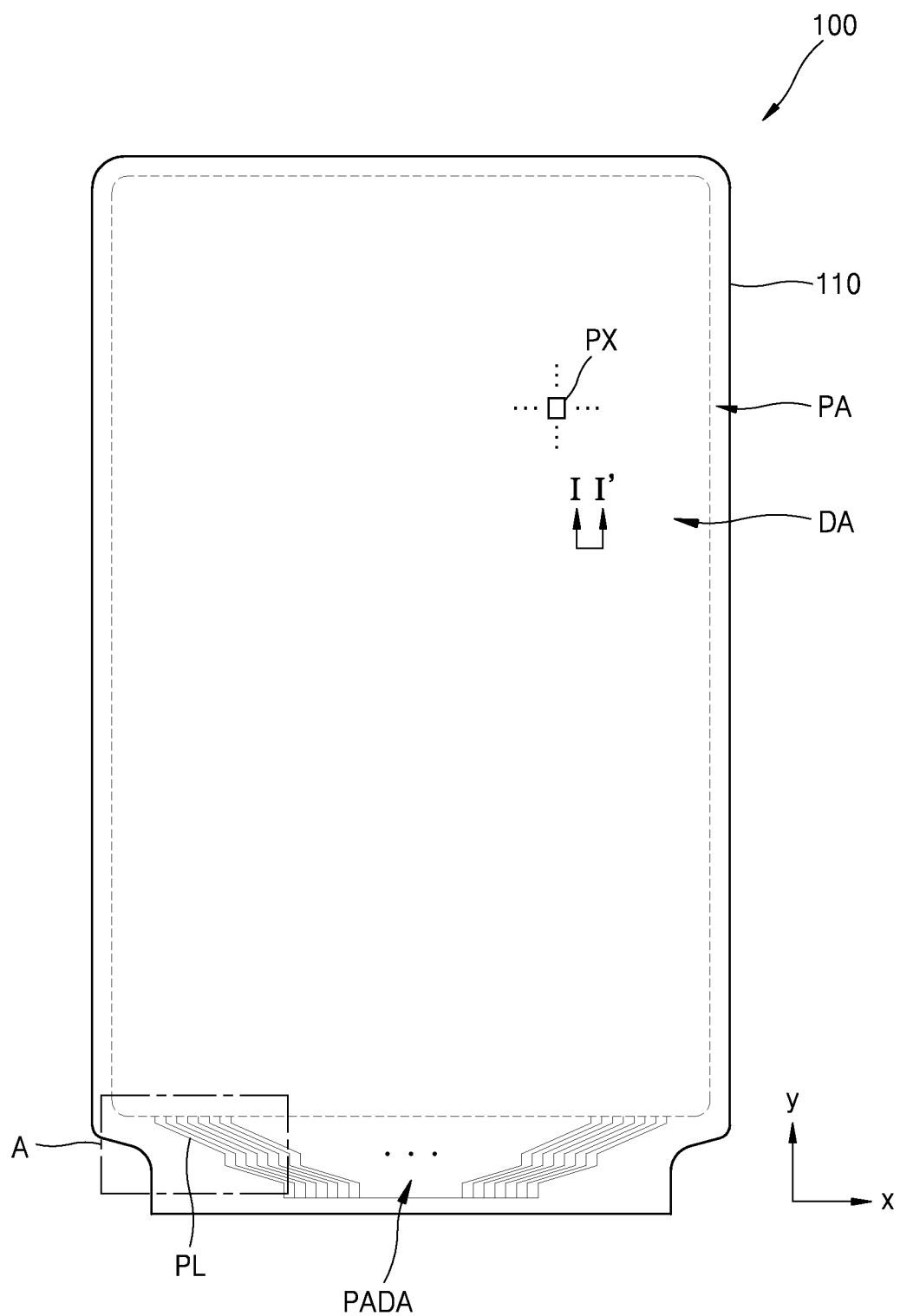
FIG. 1 is a schematic plan view of a display device according to an embodiment.

Since the present disclosure may have various modifications and several embodiments, embodiments are shown in the drawings and will be described in detail. Effects, features, and a method of achieving the same will be specified with reference to the embodiments described below in detail together with the attached drawings. However, the embodiments may have different forms and should not be construed as being limited to the descriptions set forth herein.

While such terms as "first," "second," etc., may be used to describe various components, such components are not be limited to the above terms. The above terms are used only to distinguish one component from another.

An expression used in the singular encompasses the expression of the plural, unless it has a clearly different meaning in the context.

In the present specification, it is to be understood that the terms such as "including" or "having" are intended to indicate the existence of the features or components disclosed in the specification, and are not intended to preclude the possibility that one or more other features or components may be added.

It will be understood that when a layer, region, or component is referred to as being "formed on" another layer, region, or component, it may be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

The embodiments will be described below in more detail with reference to the accompanying drawings. Those components that are the same or are in correspondence are rendered the same reference numeral regardless of the figure number.

Figure 2:
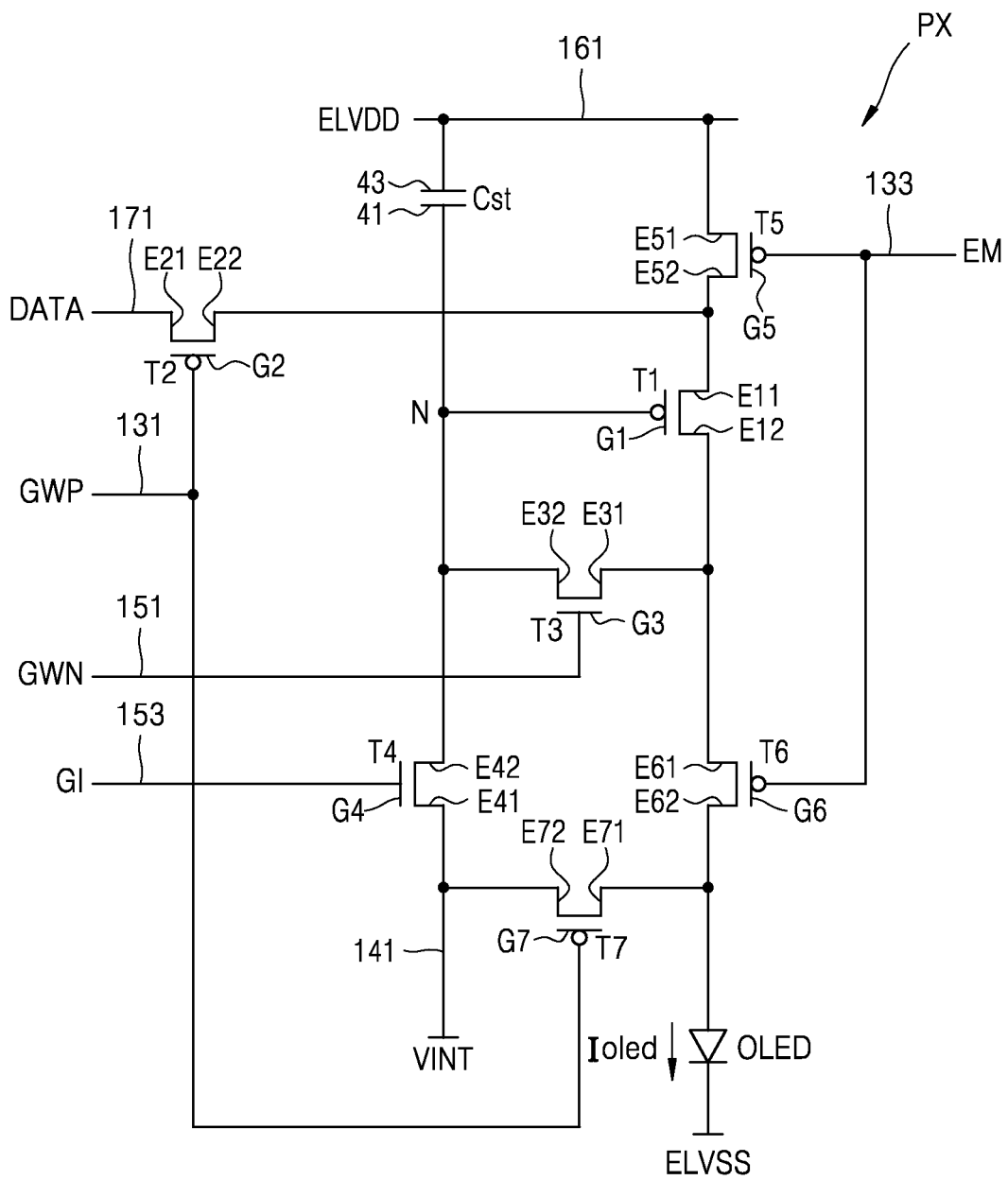
FIG. 2 is an equivalent circuit diagram of one pixel included in the display device of FIG. 1.

FIG. 1 is a schematic plan view of a display device 100 according to an embodiment. FIG. 2 is an equivalent circuit diagram of a pixel PX included in the display device 100 of FIG. 1.

Referring to FIG. 1, the display device 100 according to an embodiment includes a display area DA and a peripheral area PA outside the display area DA. The peripheral area PA may surround the display area DA. It may also be understood that a substrate 110 includes the display area DA and the peripheral area PA described above.

A plurality of pixels PX may be located in the display area DA, and the peripheral area PA may include a pad area PADA in which various electronic elements or printed circuit boards or the like are electrically bonded, and a plurality of wirings PL through which an electrical signal to be applied to the pixels PX is transmitted may be located in the peripheral area PA.

FIG. 1 may also be regarded as a plan view illustrating, for example, the substrate 110 during a manufacturing process of the display device 100. In the display device 100 in a finalized state or an electronic device such as a smartphone, which includes the display device 100, a portion of the substrate 110 or the like may be bent to minimize an area of the peripheral area PA perceived by a user.

For example, the peripheral area PA may include a bending area, and the bending area may be located between the pad area PADA and the display area DA. In this case, the substrate 110 may be bent in the bending area such that at least a portion of the pad area PADA overlaps the display area DA. However, a bending direction is set such that the pad area PADA does not cover a front surface of the display area DA which displays images but is located at the back of the display area DA. Accordingly, a user actually perceives display area DA as occupying most portions of the display device 100.

The substrate 110 may include various materials having flexible or bendable properties. For example, the substrate 110 may include a polymer resin such as a polyether sulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), cellulose acetate propionate (CAP), etc. Also, the substrate 110 may have a multi-layer structure including two layers including a polymer resin as described above and a barrier layer including an inorganic material (e.g., silicon oxide, silicon nitride, silicon oxynitride) between the two layers, or other such modifications may be made. However, the present disclosure is not limited thereto, and the substrate 110 may also include glass.

A pixel PX located in the display area DA may include a display element. FIG. 2 is an equivalent circuit diagram of a pixel PX. Referring to FIG. 2, the pixel PX may include a display element and a pixel circuit driving the display element. The display element may be, for example, an organic light-emitting device OLED, but is not limited thereto. Hereinafter, a pixel PX including an organic light-emitting device OLED as a display element will be described as an example.

Referring to FIG. 2, each pixel PX includes signal lines 131, 133, 151, 153, and 171, an initialization voltage line 141, and a power voltage line 161, but the present disclosure is not limited thereto. According to another embodiment, at least one of the signal lines 131, 133, 151, 153, and 171, the initialization voltage line 141, and the power voltage line 161 may be shared between neighboring pixels PX.

The signal lines include a first scan line 131 through which a first scan signal GWP is transmitted, a second scan line 151 through which a second scan signal GWN is transmitted, a third scan line 153 through which a third scan signal GI is transmitted, an emission control line 133 through which an emission control signal EM is transmitted, and a data line 171 which intersects with the first scan line 131 and through which a data signal DATA is transmitted.

The power voltage line 161 is used to transmit a first power voltage ELVDD to a first transistor T1, and the initialization voltage line 141 is used to transmit, to the pixel PX, an initialization voltage VINT initializing the first transistor T1 and a pixel electrode of an organic light-emitting device OLED.

A pixel circuit of the pixel PX may include a plurality of transistors T1 through T7 and a capacitor Cst. First electrodes E11 through E71 and second electrodes E12 through E72 of FIG. 2 may be either a source electrode (source region) or a drain electrode (drain region) according to a transistor type (p-type or n-type) and/or operating conditions. First through seventh transistors T1 through T7 may be implemented using thin film transistors.

The first transistor T1 includes a gate electrode G1 connected to a first electrode 41 of the capacitor Cst, a first electrode E11 connected to the power voltage line 161 through the fifth transistor T5, and a second electrode E12 electrically connected to the pixel electrode of the organic light-emitting device OLED through the sixth transistor T6. The first transistor T1 functions as a driving transistor, and receives a data signal DATA according to a switching operation of the second transistor T2 to supply a current to the organic light-emitting device OLED.

The second transistor T2 includes a gate electrode G2 connected to the first scan line 131, a first electrode E21 connected to the data line 171, and a second electrode E22 connected to the first electrode E11 of the first transistor T1. The second transistor T2 is turned on according to a second scan signal GWP received through the first scan line 131 to perform a switching operation of transmitting the data signal DATA transmitted to the data line 171, to the first electrode E11 of the first transistor T1.

The third transistor T3 includes a gate electrode G3 connected to the second scan line 151, a first electrode E31 connected to the second electrode E12 of the first transistor T1, and a second electrode E32 connected to the first electrode 41 of the capacitor Cst, a second electrode E42 of the fourth transistor T4, and the gate electrode G1 of the first transistor T1. The first electrode E31 is connected to the pixel electrode of the organic light emitting device OLED through the sixth transistor T6. The third transistor T3 is turned on according to the scan signal GWN received through the second scan line 151 and diode-connects the first transistor T1.

The fourth transistor T4 includes a gate electrode G4 connected to the third scan line 153, a first electrode E41 connected to the initialization voltage line 141, and the second electrode E42 connected to the first electrode 41 of the capacitor Cst, the second electrode E32 of the third transistor T3, and the gate electrode G1 of the first transistor T1. The fourth transistor T4 is turned on according to a third scan signal GI received through the third scan line 153 to transmit an initialization voltage VINT to the gate electrode G1 of the first transistor T1 to thereby initialize a gate voltage of the first transistor T1.

The fifth transistor T5 includes a gate electrode G5 connected to the emission control line 133, a first electrode E51 connected to the power voltage line 161, and a second electrode E52 connected to the first electrode E11 of the first transistor T1 and the second electrode E22 of the second transistor T2.

The sixth transistor T6 includes a gate electrode G6 connected to the emission control line 133, a first electrode E61 connected to the second electrode E12 of the first transistor T1 and the first electrode E31 of the third transistor T3, and a second electrode E62 connected to the pixel electrode of the organic light-emitting device OLED.

As the fifth transistor T5 and the sixth transistor T6 are simultaneously turned on according to an emission control signal EM received through the emission control signal 133, a current flows in the organic light-emitting device OLED.

The seventh transistor T7 includes a gate electrode G7 connected to the first scan line 131, a first electrode E71 connected to the second electrode E62 of the sixth transistor T6 and the pixel electrode of the organic light-emitting device OLED, and a second electrode E72 connected to the initialization voltage line 141. The seventh transistor T7 is turned on according to a first scan signal GWP received through the first scan line 131 to initialize a voltage of the pixel electrode of the organic light-emitting device OLED.

The capacitor Cst includes a first electrode 41 connected to the gate electrode G1 of the first transistor T1 and a second electrode 43 connected to the power voltage line 161. The first electrode 41 of the capacitor Cst is also connected to the second electrode E32 of the third transistor T3 and the second electrode E42 of the fourth transistor T4.

The organic light-emitting device OLED may include a pixel electrode and a common electrode facing the pixel electrode, and the common electrode may receive a second power voltage ELVSS. As the organic light-emitting device OLED receives a current from the first transistor T1 to emit light, the display device 100 may display an image.

Meanwhile, at least some of the first through seventh transistors T1 through T7 may include different types of semiconductor layers from each other. For example, the first transistor T1 functioning as a driving transistor may include a semiconductor layer formed of polycrystalline silicon, and at least one of the second transistor T2 which is a switching transistor and third through seventh transistors T3 through T7 may include an oxide semiconductor layer.

Polycrystalline silicon has high electron mobility and high reliability. As the first transistor T1 which has a direct influence on brightness of the organic light-emitting device OLED includes a semiconductor layer formed of polycrystalline silicon, the display device 100 of a high resolution may be implemented.

In addition, a thin film transistor including an oxide semiconductor layer has a relatively low off-current and is drivable at a low frequency. Thus, when at least one of the other transistors except the first transistor T1, that is, at least one of the second through seventh transistors T2 through T7, includes an oxide semiconductor layer, power consumption of the display device 100 may be reduced.

Figure 3:
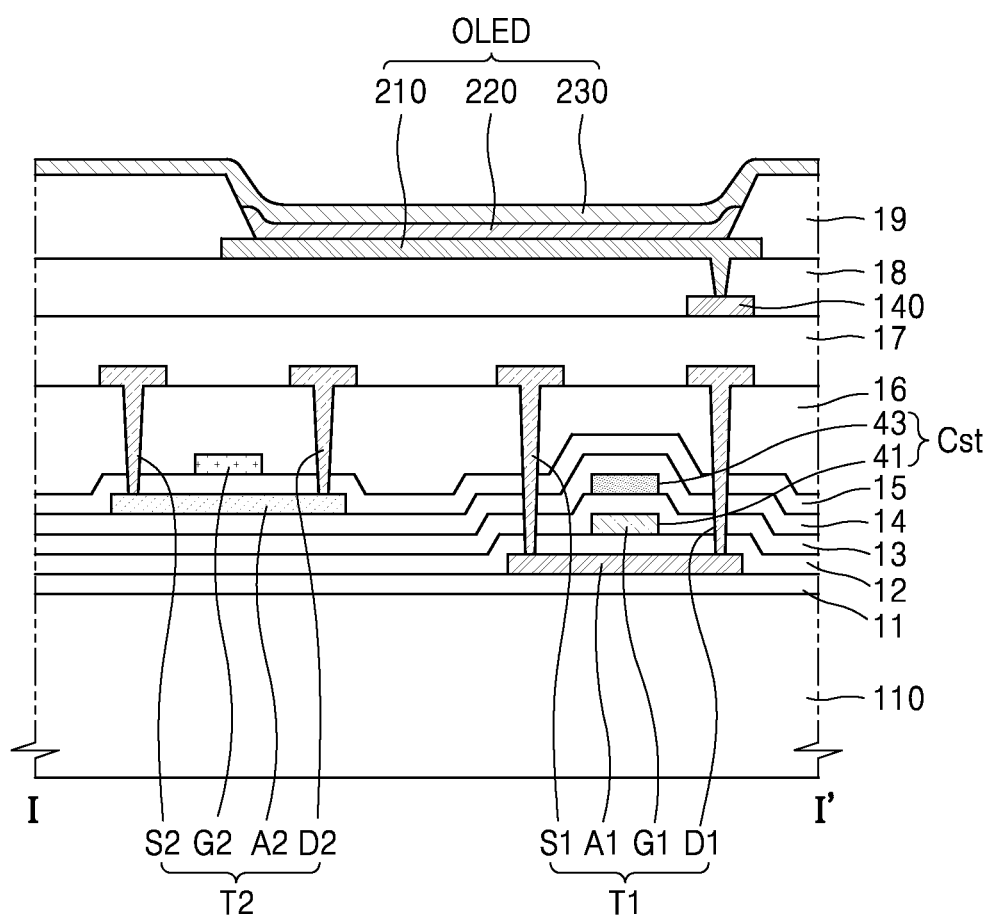
FIG. 3 is a schematic cross-sectional view taken along line I-I' of FIG. 1, according to an example.

FIG. 3 is a schematic cross-sectional view of a portion of the display device 100, in which only the first transistor T1, the second transistor T2, the capacitor Cst, and the organic light-emitting device OLED from among the above-described elements of the pixel PX are illustrated for convenience of description.

Referring to FIG. 3, a buffer layer 11 may be arranged on the substrate 110. The buffer layer 11 may provide a flat surface on an upper portion of the substrate 110 and block impurities or moisture penetrating through the substrate 110. For example, the buffer layer 11 may include an inorganic material such as silicon oxide, silicon nitride, silicon oxynitride, aluminum oxide, aluminum nitride, titanium oxide, titanium nitride, etc. or an organic material such as polyimide, polyester, acryl, etc., and may have a stack structure including a plurality of materials selected from the above-stated materials.

The first transistor T1 is located on the buffer layer 11. The first transistor T1 includes a first semiconductor layer A1, a first gate electrode G1, a first source electrode S1, and a first drain electrode D1. The first transistor T1 functions as a driving transistor, and thus the first semiconductor layer A1 may include polycrystalline silicon.

The first gate electrode G1 is arranged on the first semiconductor layer A1, and the source electrode S1 and the drain electrode D1 are electrically connected according to a signal applied to the first gate electrode G1. The first gate electrode G1 may include, for example, one or more materials selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), and may have a single-layered or multi-layered structure. Here, in order to ensure insulating properties of the first semiconductor layer A1 and the first gate electrode G1, a first insulating layer 12 formed of an inorganic material such as silicon oxide, silicon nitride, silicon oxynitride, etc. may be interposed between the first semiconductor layer A1 and the first gate electrode G1.

The capacitor Cst may overlap the first gate electrode G1. The capacitor Cst includes the first electrode 41 and the second electrode 43, and a second insulating layer 13 including an inorganic material such as silicon oxide, silicon nitride or silicon oxynitride may be disposed between the first electrode 41 and the second electrode 43. The first gate electrode G1 also functions as the first electrode 41 of the capacitor Cst. That is, the first gate electrode G1 and the first electrode 41 may be integrally formed.

The second electrode 43 of the capacitor Cst is arranged on the second insulating layer 13 to at least partially overlap the first electrode 41 of the capacitor Cst. The second electrode 43 may be electrically connected to the power voltage line 161 (FIG. 2) through which a driving voltage is transmitted.

A third insulating layer 14 including an inorganic material such as silicon oxide, silicon nitride or silicon oxynitride may be on the second electrode 43, and the second transistor T2 may be located on the third insulating layer 14. That is, the second transistor T2 may be at a different height from the first transistor T1.

The second transistor T2 includes a second semiconductor layer A2, a second gate electrode G2, a second source electrode S2, and a second drain electrode D2. The second transistor T2 functions as a switching transistor, and thus the second semiconductor layer A2 may include an oxide semiconductor. The oxide semiconductor may include a metal oxide of, for example, zinc (Zn), indium (In), gallium (Ga), tin (Sn), titanium (Ti), a metal such as zinc (Zn), indium (In), gallium (Ga), tin (Sn), titanium (Ti), and a mixture of oxides of the metals. For example, an oxide semiconductor may include a Zn oxide-based material such as a Zn oxide, an In—Zn oxide, a Ga—In—Zn oxide or the like. In some embodiments, the oxide semiconductor may be In—Ga—Zn—O (IGZO) semiconductor including ZnO in which a metal such as In and Ga is contained.

A second gate electrode G2 is arranged on the second semiconductor layer A2, and a fourth insulating layer 15 may be interposed between the second semiconductor layer A2 and the second gate electrode G2. That is, the second gate electrode G2 is arranged at a different height from the first gate electrode G1, and the second through fourth insulating layers 13 through 15 may be interposed between the second gate electrode G2 and the first gate electrode G1. Different heights refer to different distances from the substrate 110 due to different layers are used to form the first gate electrode G1 and the second gate electrode G2.

The second gate electrode G2 may include, for example, one or more materials selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), and may have a single-layered or multi-layered structure. The fourth insulating layer 15 may include an inorganic material such as silicon oxide, silicon nitride, silicon oxynitride or the like.

A fifth insulating layer 16 may be arranged on the second gate electrode G2, and may include an inorganic material such as silicon oxide, silicon nitride, silicon oxynitride or the like and have a single-layered or multi-layered structure.

The first source electrode S1, the first drain electrode D1, the second source electrode S2, and the second drain electrode D2 are arranged on the fifth insulating layer 16.

The first source electrode S1 and the first drain electrode D1 may be respectively electrically connected to the first semiconductor layer A1 through a contact hole formed in the first through fifth insulating layers 12 through 16, and the second source electrode S2 and the second drain electrode D2 may be respectively electrically connected to the second semiconductor layer A2 through a contact hole formed in the fourth and fifth insulating layers 15 and 16.

The first source electrode S1, the first drain electrode D1, the second source electrode S2, and the second drain electrode D2 may include one or more materials selected from, for example, Al, Pt, Pd, Ag, Mg, Au, Ni, Nd, Ir, Cr, Li, Ca, Mo, Ti, W, and Cu, in consideration of conductive properties, and may have a single-layered or multi-layered structure.

A sixth insulating layer 17 may be arranged on the first transistor T1 and the second transistor T2 having the above-described structure. For example, as illustrated in FIG. 2, when the organic light-emitting device OLED is arranged at a higher level than the first transistor T1 and the second transistor T2, the sixth insulating layer 17 covers the first transistor T1 and the second transistor T2 and thereby planarizes curvature resulting from the first transistor T1 and the second transistor T2. The sixth insulating layer 17 may include, for example, an organic material such as acryl, benzocyclobutene (BCB), hexamethyldisiloxane (HMDSO), etc.

A conductive layer 140 may be arranged on the sixth insulating layer 17. The conductive layer 140 may be a connecting electrode electrically connecting an electrode of one of a plurality of transistors of the pixel PX, including the first transistor T1 and the second transistor T2, and the capacitor Cst to the pixel electrode 210.

A seventh insulating layer 18 including an organic material such as acryl, BCB, or HMDSO is arranged on the conductive layer 140, and the organic light-emitting device OLED including the pixel electrode 210, an opposite electrode 230, and an intermediate layer 220 that is interposed between the pixel electrode 210 and the opposite electrode 230 and includes an emissive layer is disposed on the seventh insulating layer 18.

The pixel electrode 210 may be electrically connected to the conductive layer 140 through a contact hole formed in the seventh insulating layer 18. The pixel electrode 210 may be a transparent electrode, a semi-transparent or a reflective electrode. When the pixel electrode 210 is a transparent electrode or a semi-transparent electrode, the pixel electrode 210 may include, for example, ITO, IZO, $In_2O_3$, IGO, or AZO. When the pixel electrode 210 is a reflective electrode, the pixel electrode 210 may include a reflective layer including Ag, Mg, Al, Pt, Pd, Au, Ni, Nd, Ir, Cr, or a compound thereof, etc. and a layer including ITO, IZO, $In_2O_3$, IGO, or AZO. However, one or more embodiments are not limited thereto, that is, the pixel electrode 210 may include various materials and may have various structures, e.g., a single-layered or multi-layered structure.

An eighth insulating layer 19 may be arranged on the seventh insulating layer 18. The eighth insulating layer 19 includes an opening exposing a center of the pixel electrode 210, to define pixels. Also, in the example illustrated in FIG. 3, the eighth insulating layer 18 covers an edge of the pixel electrode 210 to increase a distance between the edge of the pixel electrode 210 and the opposite electrode 230 above the pixel electrode 210, thereby preventing generation of an arc at the edge of the pixel electrode 210. The eighth insulating layer 18 may include, for example, an organic insulating material such as polyimide, HMDSO, etc.

The intermediate layer 220 of the organic light-emitting device OLED includes an emissive layer. The emissive layer may include a polymer or low-molecular weight organic material, each of which emits light of a predetermined color. Also, the intermediate layer 220 may include at least one functional layer from among a hole transport layer (HTL), a hole injection layer (HIL), an electron transport layer (ETL), and an electron injection layer (EIL). The functional layer may include an organic material.

The opposite electrode 230 may be formed to cover the plurality of organic light-emitting devices OLED to correspond to a plurality of pixel electrodes 210. The opposite electrode 230 may be a transparent electrode, a semi-transparent electrode or a reflective electrode. When the opposite electrode 230 is a transparent electrode or a semi-transparent electrode, the opposite electrode 230 may include a layer including metal of a small work function, that is, Li, Ca, LiF/Ca, LiF/Al, Al, Ag, Mg, and a compound thereof, and a transparent conductive layer or a semi-transparent conductive layer including ITO, IZO, ZnO, $In_2O_3$, etc. When the opposite electrode 230 is a reflective electrode, the opposite electrode 230 may include a layer including Li, Ca, LiF/Ca, LiF/Al, Al, Ag, Mg, and a compound thereof. A structure and a material included in the opposite electrode 230 are not limited to the above examples, but various modifications may be implemented.

An encapsulation layer (not shown) protecting the organic light-emitting device OLED from external moisture, oxygen, or the like may be located on the opposite electrode 230. The encapsulation layer may cover the display area DA and be extended to the outside of the display area DA. The encapsulation layer may include an inorganic encapsulation layer including at least one inorganic material and an organic encapsulation layer including at least one organic material. In some embodiments, an encapsulation layer may have a structure in which a first inorganic encapsulation layer/an organic encapsulation layer/a second inorganic encapsulation layer are stacked. In addition, various functional layers such as a polarization layer used to reduce reflection of external light, a black matrix, and a color filter, and/or a touch screen layer including a touch screen, may be provided on the encapsulation layer.

Some of the other transistors of the pixel circuit (the third through seventh transistors T3 through T7) may also include an oxide semiconductor layer like the second transistor T2. That is, according to the present disclosure, as a driving transistor including a polycrystalline silicon semiconductor having high reliability as a semiconductor layer and at least one thin film transistor including an oxide semiconductor having a relatively low leakage current as a semiconductor layer are included, and thus, the display device 100 may be provided with high reliability and high power consumption efficiency.

Figure 4:
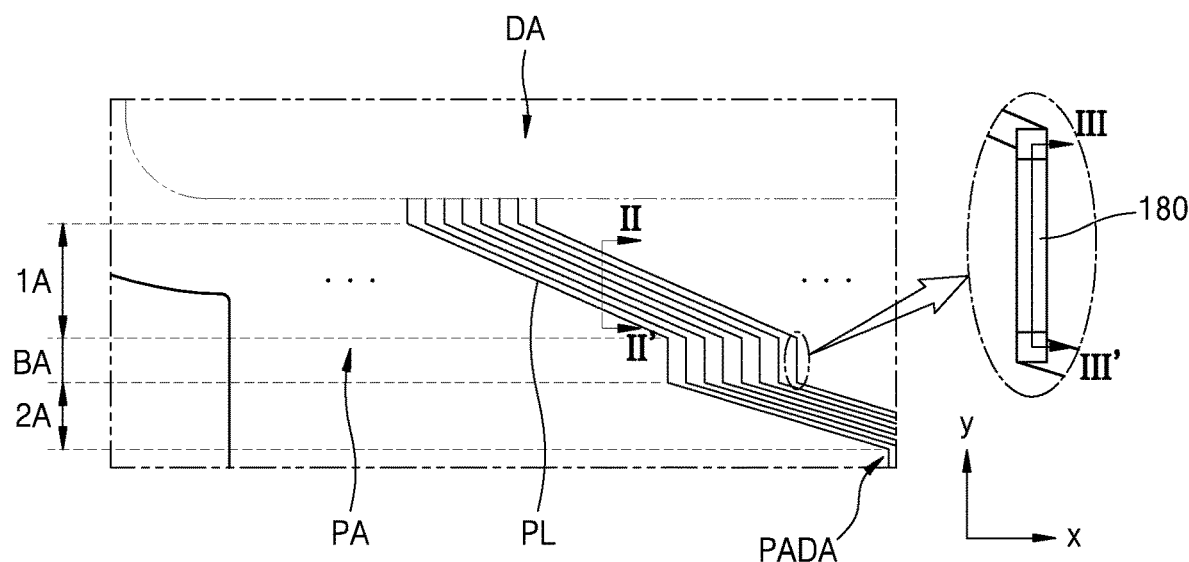
FIG. 4 is a schematic plan view of area A of FIG. 1.
Figure 5:
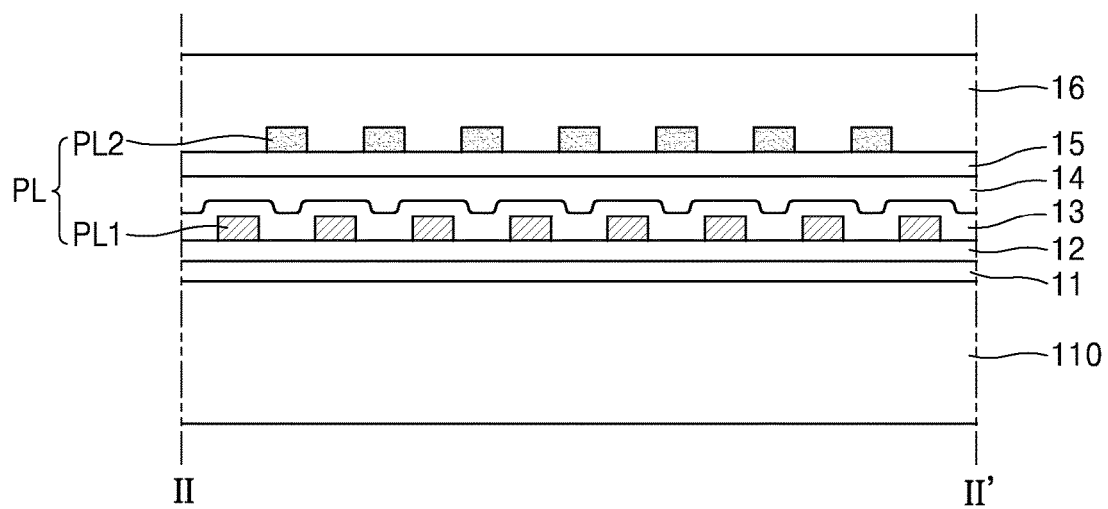
FIG. 5 is a schematic cross-sectional view taken along line II-II' of FIG. 4, according to an example.
Figure 6A:
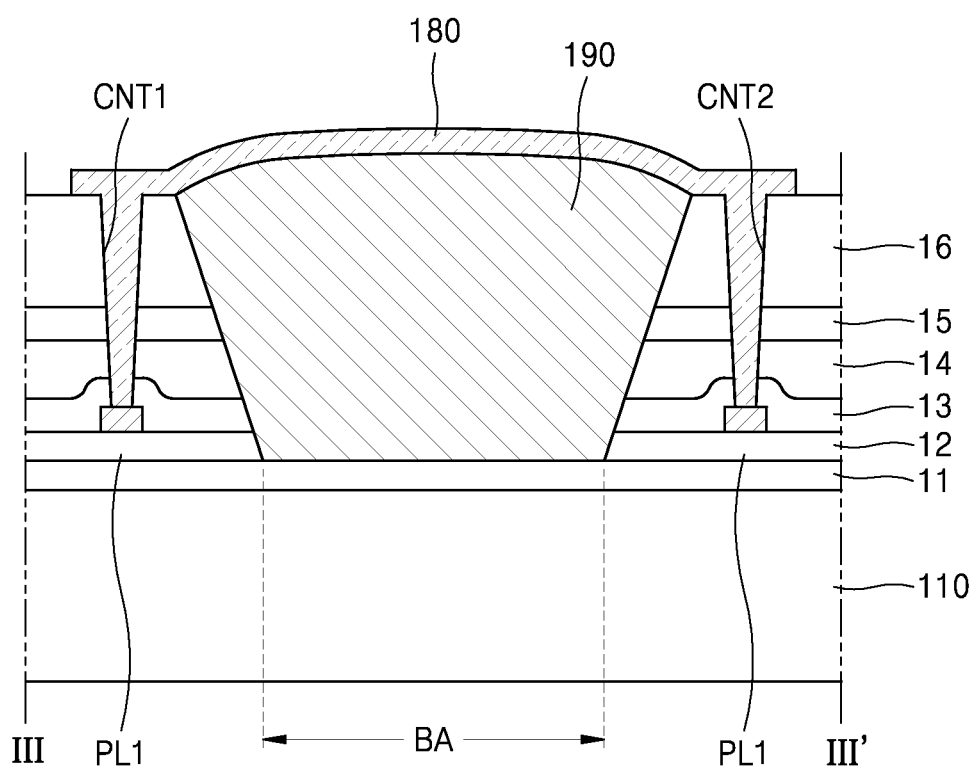
FIGS. 6A and 6B are a schematic cross-sectional view taken along line III-III' of FIG. 4.
Figure 6B:
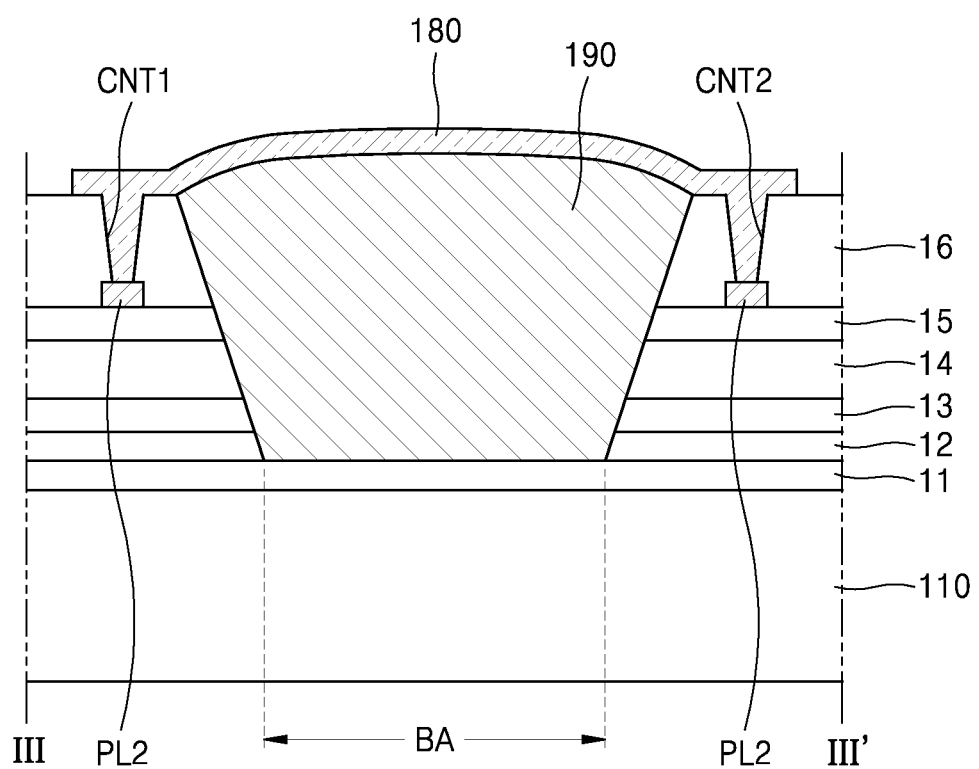

FIG. 4 is a schematic plan view of an area A of FIG. 1. FIG. 5 is a schematic cross-sectional view of an example of a cross-section II-II' of FIG. 4. FIGS. 6A and 6B are a schematic cross-sectional view of an example of a cross-section III-III' of FIG. 4.

Various electrical signals may be applied to the display area DA. For example, a data signal used to adjust brightness of each pixel may be applied to the display area DA, and to this end, various wirings such as the data line 171 (FIG. 2) may be located within the display area DA. Also, the scan lines 131, 151, and 153 (FIG. 2) used to apply a scan signal may be located in the display area DA.

Wirings PL may be located between the pad area PADA and the display area DA and may be connected to the data line 171 (FIG. 2) or the scan lines 131, 151, and 153 (FIG. 2) to transmit a data signal or a scan signal from a driver attached to the pad area PADA to the display area DA.

A length of the pad area PADA may be shorter than a side of the display area DA adjacent to the pad area PADA, and accordingly, distances between the wirings PL may become shorter from the display area DA towards the pad area PADA. That is, a distance between first ends (−y direction) of the wiring PL through which an electrical signal is received from an integrated circuit IC or a printed circuit board attached to the pad area PADA may be smaller than a distance between second ends (+y direction) of the wirings PL through which an input signal is transmitted to the display area DA. In addition, the distance between the wirings PL is inevitably reduced under the conditions where the number of wirings PL is increased due to a number of pixels in the display device 100 (FIG. 1) is increased because of an increasing of resolution of the display device 100 and the peripheral area PA is reduced at the same time, and consequently, coupling between the wirings PL may increase further.

However, according to the present disclosure, as the wirings PL include first wirings PL1 and second wiring PL2 located at different levels, the above-described problem may be solved. Different levels indicate different distances from the substrate 110 due to different layers are disposed between the substrate and the wirings PL. In detail, the first wirings PL1 may be located on the first insulating layer 12, and the second wirings PL may be located on the fourth insulating layer 15, and the first wirings PL1 and the second wirings PL2 may be alternately arranged with respect to each other. That is, the second insulating layer 13, the third insulating layer 14, and the fourth insulating layer 15 are located between the first wiring PL1 and the second wiring PL2 that are adjacent to each other, and accordingly, compared to when the first wirings PL1 and the second wirings PL2 are arranged on a same layer, a distance between the first wiring PL1 and the second wiring PL2 that are adjacent to each other is increased to reduce parasitic capacitance between the first wiring PL and the second wiring PL2 and thus, signal interference between therebetween may be prevented or reduced.

Meanwhile, as the first wirings PL1 are located on the first insulating layer 12, the first wirings PL1 include a same material as that of the first gate electrode G1 (FIG. 3) of the first transistor T1 (FIG. 3) and may be formed together with the first gate electrode G1 (FIG. 3). In addition, the second wirings PL2 located on the fourth insulating layer 15 may include a same material as that of the second gate electrode G2 (FIG. 3) of the second transistor T2 (FIG. 3) and may be formed together with the second gate electrode G2 (FIG. 3).

The peripheral area PA may include a bending area BA between the pad area PADA and the display area DA, and as the display device 100 (FIG. 1) is bent in the bending area BA, an area of the peripheral area PA perceived by a user may be minimized. The first wirings PL1 and the second wirings PL2 may have disconnected portions in the bending area BA. That is, the first wirings PL1 and the second wirings PL2 are respectively formed only in a first area 1A between the display area DA and the bending area BA, and a second area 2A between the bending area BA and the pad area PADA, and one first wiring PL1 and one second wiring PL2 respectively located in the first area 1A and the second area 2A may be connected by a connecting wire 180.

The bending area BA is an area from which the first through fifth insulating layers 12 through 16 are removed, and may facilitate bending in the bending area BA and prevent cracks in the first through fifth insulating layers 12 through 16 during bending. In the area from which the first through fifth insulating layers 12 through 16 are removed may be filled with an organic material layer 190 (FIG. 6). The organic material layer 190 may be disposed on non-bending areas adjacent to the bending area BA. The organic material layer 190 not only compensates steps of the bending area BA due to removed insulating layers, the first through fifth insulating layers 12 through 16, but may also absorb stress occurring due to bending. Accordingly, concentration of stress occurring in various connecting wires on the bending area BA which transmit an electrical signal from a pad unit (not shown) in the pad area PADA to the display area DA during bending may be effectively minimized.

The organic material layer 190 as described above may include at least one material selected from acryl, metacryl, polyester, polyethylene, polypropylene, polyethylene terephthalate, polyethylene naphthalate, polycarbonate, polyimide, polyethylene sulfonate, polyoxymethylene, polyarylate, and hexamethyldisiloxane.

The connecting wire 180 may be located on the organic material layer 190. The connecting wire 180 may connect the first wirings PL1 respectively located in the first area 1A and the second area 2A through a first contact hole CNT1 and a second contact hole CNT2 passing through the first through fifth insulating layers 12 through 16. Also, the connecting wire 180 may connect the second wirings PL2 respectively located in the first area 1A and the second area 2A through a contact hole passing the fifth insulating layer 16 as shown FIG. 6B.

The connecting wire 180 crossing the bending area BA may cross the bending area BA by a shortest distance. That is, the connecting wire 180 may extend in a direction perpendicular to a length direction of the pad area PADA arranged at a side of the display area DA. Accordingly, a distance between the connecting wires 180 on the bending area BA may be greater than a distance between wirings PL extending obliquely in the first area 1A and the second area 2A. Thus, the connecting wires 180 may have a sufficient distance therebetween even when they are arranged on a same layer.

In addition, the connecting wire 180 may include a material having a high level of ductility to thereby prevent cracks in the connecting wire 180 or a short-circuit in the connecting wire 180. For example, a plurality of wirings PL may include molybdenum, and the connecting wire 180 may include aluminum. The connecting wire 180 may located on the same level with the first source electrode S1, the first drain electrode D1, the second source electrode S2, and the second drain electrode D2. In this case the first source electrode S1, the first drain electrode D1, the second source electrode S2, and the second drain electrode D2 have stacked structure of Ti/Al/Ti.

Figure 7:
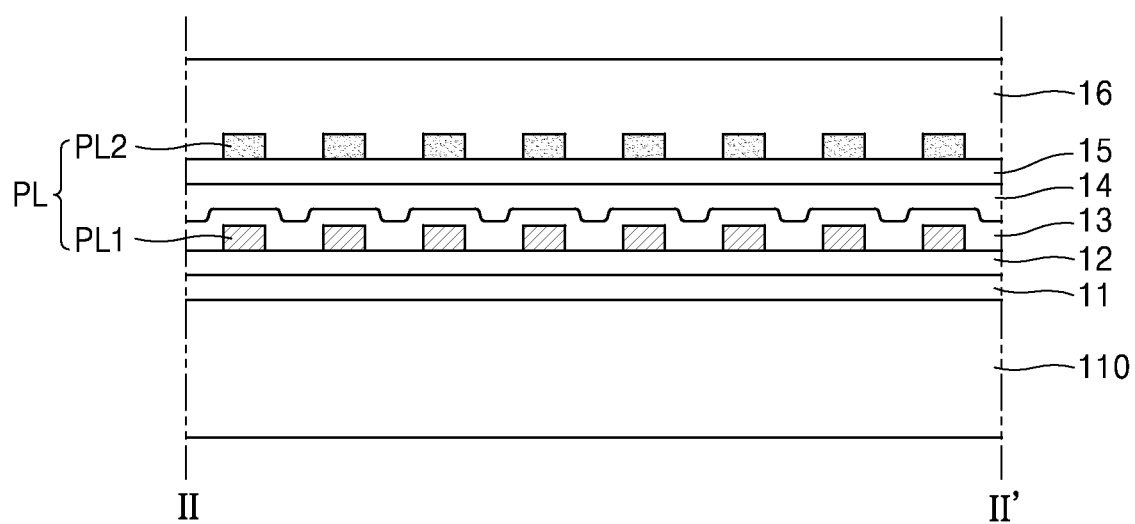
FIG. 7 is a schematic cross-sectional view taken along line II-II' of FIG. 4, according to another example.

FIG. 7 is a schematic cross-sectional view taken along line II-II' of FIG. 4, according to another example. Hereinafter, description will focus on differences from the above description. Also, description will be provided with reference to both FIGS. 4 and 7.

FIG. 7 illustrates the peripheral area PA between the display area DA and the pad area PADA, and the buffer layer 11 is formed on the substrate 110 of the peripheral area PA, and the first insulating layer 12, the second insulating layer 13, the third insulating layer 14, the fourth insulating layer 15, and the fifth insulating layer 16 may be stacked sequentially on the buffer layer 11.

In addition, the wirings PL in the peripheral area PA may include first wirings PL1 and second wirings PL2 located at different levels from each other. For example, the first wirings PL1 may be located on the first insulating layer 12, and the second wirings PL2 may be located on the fourth insulating layer 15. The first wirings PL1 and the second wirings PL2 may be located such that they at least partially overlap each other in a vertical direction. For example, the first wirings PL1 and the second wirings PL2 may completely overlap each other according to a plan view.

When the first wirings PL1 and the second wirings PL2 overlap at least partially in a vertical direction, an area occupied by the first wirings PL1 and the second wirings PL2 may be reduced compared to when the first wirings PL1 and the second wirings PL2 are arranged in parallel to each other on a same layer. That is, as a distance between the first wirings PL1 is increased, when the first wirings PL1 and the second wirings PL2 extend obliquely in the first area 1A and the second area 2A, an angle thereof with respect to a first direction X may be further reduced, and thus, a distance between the display area DA and the pad area PADA may be further reduced. Accordingly, when bending the display device 100 (FIG. 1) in the bending area BA, a size of dead space remaining at an end of the display area DA is also reduced, thereby implementing the display device 100 (FIG. 1) with a high screen usage rate.

Meanwhile, as the second insulating layer 13, the third insulating layer 14, and the fourth insulating layer 15 are located between the first wirings PL1 and the second wirings PL2, some of which overlap at least partially in a vertical direction, compared to when the first wirings PL1 and the second wirings PL2 are arranged on a same layer, a distance between the first wirings PL1 and the second wiring PL2 adjacent to each other may be increased to reduce parasitic capacitance between the first wiring PL1 and the second wiring PL2, thus preventing or reducing signal interference therebetween.

The first wirings PL1 may include a same material as that of the first gate electrode G1 (FIG. 3) of the first transistor T1 (FIG. 3) and may be formed together with the first gate electrode G1 (FIG. 3). In addition, the second wirings PL2 may include a same material as that of the second gate electrode G2 (FIG. 3) of the second transistor T2 (FIG. 3) and may be formed together with the second gate electrode G2 (FIG. 3).

The first transistor T1 (FIG. 3) may be a driving transistor including a polycrystalline silicon semiconductor having high reliability as a semiconductor layer, and the second transistor T2 (FIG. 3) may be a switching transistor including an oxide semiconductor having a relatively low leakage current as a semiconductor layer. Thus, according to the present disclosure, the display device 100 (FIG. 1) having high reliability and high power consumption efficiency may be provided, and at the same time, coupling between the wirings PL may be prevented or reduced through efficient spatial arrangement of the wirings PL, through which an electrical signal is transmitted to the display area DA.

According to embodiments of the present disclosure, two adjacent wirings from among wirings, through which an electrical signal is applied to a display area, are located at different heights from each other, and thus, a distance between the wirings is increased to prevent or reduce coupling occurring between the wirings. In addition, the display device includes different types of transistors to thereby maintain a high quality and reduce power consumption. However, the scope of the present disclosure is not limited by the effects described above.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display device comprising:
    a substrate having a display area and a peripheral area outside the display area;
    a first transistor including a first gate electrode, a first semiconductor layer, and a first insulating layer disposed between the first gate electrode and the first semiconductor layer;
    a capacitor overlapping the first transistor and comprising a first electrode, a second electrode, and a second insulating layer disposed between the first electrode and the second electrode, the first electrode being the first gate electrode and the second electrode overlapping the first electrode;
    a third insulating layer disposed on the second electrode;
    a second transistor including a second gate electrode, a second semiconductor layer, and a fourth insulating layer disposed between the second gate electrode and the second semiconductor layer, the second gate electrode of the second transistor being disposed over the first gate electrode of the first transistor and the second insulating layer and the third insulating layer being disposed between the first gate electrode and the second semiconductor layer; and
    a plurality of wirings located over the peripheral area of the substrate,
    wherein the plurality of wirings comprise first wirings and second wirings, the first wirings and the second wirings being located at different levels on the substrate and are alternately arranged with each other, and
    wherein the first wirings and the first gate electrode are disposed on the first insulating layer to directly contact an upper surface of the first insulating layer, are disposed at a same level on the substrate, and include a same material, and the second wirings and the second gate electrode are disposed on the fourth insulating layer to directly contact an upper surface of the fourth insulating layer, are disposed at a same level on the substrate, and include a same material.

2. The display device of claim 1, wherein the first semiconductor layer includes polycrystalline silicon, and the second semiconductor layer includes an oxide semiconductor.

3. The display device of claim 2, further comprising a display element electrically connected to the first transistor, wherein the first transistor is a driving transistor and the second transistor is a switching transistor.

4. The display device of claim 1,
    wherein the second semiconductor layer directly contacts the third insulating layer.

5. The display device of claim 1, wherein the second insulating layer, the third insulating layer and the fourth insulating layer are disposed between the first wirings and the second wirings.

6. The display device of claim 5, wherein the first wirings and the second wirings at least partially overlap each other in a vertical direction.

7. The display device of claim 1, further comprising a fifth insulating layer disposed on the second gate electrode,
wherein the peripheral area further comprises a pad area and a bending area that is disposed between the display area and the pad area,
wherein the bending area is an area from which the first insulating layer, the second insulating layer, the third insulating layer, the fourth insulating layer, and the fifth insulating layer are removed, and an organic material layer is located in the bending area.

8. The display device of claim 7, wherein the first wirings and the second wirings include disconnected portions in the bending area, and the first wirings and the second wirings that are disconnected in the bending area are connected via a connecting wire located on the organic material layer.

9. A display device comprising:
a substrate having a display area and a peripheral area outside the display area;
a first transistor located over the display area of the substrate and comprising a first semiconductor layer including polycrystalline silicon and a first gate electrode;
a second transistor located over the display area of the substrate and comprising a second semiconductor layer including an oxide semiconductor and a second gate electrode; and
a plurality of wirings located over the peripheral area of the substrate,
wherein the first gate electrode and the second gate electrode are located at difference levels on the substrate,
wherein the plurality of wirings comprise first wirings and second wirings, the first wirings being arranged on a same layer as the first gate electrode and the second wirings being arranged on a same layer as the second gate electrode,
wherein the display device further comprises a capacitor overlapping the first transistor, the capacitor comprising a first electrode and a second electrode, the first electrode being arranged on a same layer as the first gate electrode, and the second electrode being arranged on and overlapping the first electrode,
wherein the display device further comprises a first insulating layer disposed between the first semiconductor layer and the first gate electrode, a second insulating layer disposed between the first gate electrode and the second electrode, a third insulating layer disposed between the second electrode and the second semiconductor layer, a fourth insulating layer disposed between the second semiconductor layer and the second gate electrode, and a fifth insulating layer disposed on the second gate electrode,
wherein the peripheral area further comprises a pad area and a bending area that is disposed between the display area and the pad area, and
wherein the bending area is an area from which the first insulating layer, the second insulating layer, the third insulating layer, the fourth insulating layer, and the fifth insulating layer are removed, and an organic material layer is located in the bending area.

10. The display device of claim 9, wherein the first wirings and the second wirings are alternately arranged with each other.

11. The display device of claim 9, wherein the first wirings and the second wirings at least partially overlap each other in a vertical direction.

12. The display device of claim 9, further comprising an organic light-emitting device electrically connected to the first transistor,
wherein the first transistor is a driving transistor and the second transistor is a switching transistor.

13. The display device of claim 9, wherein the first transistor further comprises a first source electrode and a first drain electrode that are located on the fifth insulating layer and electrically connected to the first semiconductor layer,
wherein the second transistor further comprises a second source electrode and a second drain electrode that are located on the fifth insulating layer and electrically connected to the second semiconductor layer.

14. The display device of claim 9, wherein the first wirings and the second wirings include disconnected portions in the bending area, and the first wirings and the second wirings that are disconnected in the bending area are connected via a connecting wire located on the organic material layer.

* * * * *